US012675144B2

(12) United States Patent
He et al.

(10) Patent No.: US 12,675,144 B2
(45) Date of Patent: Jul. 7, 2026

(54) EXPANSION MODULE, PCIE EXPANSION MODULE, CHASSIS ASSEMBLY, COMPUTER, AND SERVER CLUSTER

(71) Applicant: Cloud Intelligence Assets Holding (Singapore) Private Limited, Singapore (SG)

(72) Inventors: Yongbao He, Shenzhen City (CN); Chunjia Sun, Shenzhen City (CN)

(73) Assignee: Cloud Intelligence Assets Holding (Singapore) Private Limited, Singapore (SG)

( * ) Notice: Subject to any disclaimer, the term of this patent is extended or adjusted under 35 U.S.C. 154(b) by 53 days.

(21) Appl. No.: 18/695,888

(22) PCT Filed: Sep. 13, 2022

(86) PCT No.: PCT/CN2022/118474
§ 371 (c)(1),
(2) Date: Mar. 27, 2024

(87) PCT Pub. No.: WO2023/051230
PCT Pub. Date: Apr. 6, 2023

(65) Prior Publication Data
US 2024/0385662 A1      Nov. 21, 2024

(30) Foreign Application Priority Data
Sep. 30, 2021    (CN) .......................... 202111165350.X

(51) Int. Cl.
*G06F 1/185* (2026.01)
*G06F 13/40* (2006.01)
*H05K 7/14* (2006.01)

(52) U.S. Cl.
CPC .......... *G06F 1/185* (2013.01); *G06F 13/4068* (2013.01); *H05K 7/1417* (2013.01); *G06F 2213/0026* (2013.01)

(58) Field of Classification Search
CPC ....... G06F 1/185; G06F 1/186; H05K 7/1417; H05K 7/1421; H05K 7/1422; H05K 7/1427; H05K 7/1429; H05K 7/1435
See application file for complete search history.

(56) References Cited

U.S. PATENT DOCUMENTS

| | | | | | |
|---|---|---|---|---|---|
| 5,080,452 | A | * | 1/1992 | Tuckman | ............... A47B 63/00 |
| | | | | | 206/214 |
| 6,322,175 | B1 | * | 11/2001 | Aggus | .................. H05K 7/1424 |
| | | | | | 361/756 |

(Continued)

FOREIGN PATENT DOCUMENTS

| | | |
|---|---|---|
| CN | 101556489 | 10/2009 |
| CN | 102681625 | 9/2012 |

(Continued)

OTHER PUBLICATIONS

English Translation of International Search Report for International PCT Patent Application No. PCT/CN2022/118474 mailed Dec. 13, 2022 (2 pages).

*Primary Examiner* — Adrian S Wilson
(74) *Attorney, Agent, or Firm* — Osha Bergman Watanabe & Burton LLP

(57) ABSTRACT

An expansion module, a PCIE expansion module, a chassis assembly, a computer, and a server cluster are provided. The expansion module comprises: a bracket provided with a connecting arrangement, the bracket being detachably connected to a computer through the connecting arrangement; a first circuit board provided on the bracket and having an electrical connection structure for electrically connecting the computer and an electrical connection port for electrically (Continued)

connecting an external device, the first circuit board being electrically connected to the computer through a cable; wherein the first circuit board has two opposite ends, the electrical connection structure is led out from or located at the first end of the first circuit board, and the second end of the first circuit board is provided with the electrical connection port; an end portion of the bracket is provided with an end plate adapted to a mounting port, the end plate being provided with a first through hole; the electrical connection port extends through the first through hole such that the electrical connection port is exposed when the expansion module is connected to the computer. In the present application, an interface board may be omitted, which helps to improve the high-speed signal transmission quality of the expansion module.

14 Claims, 6 Drawing Sheets

(56)                    References Cited

U.S. PATENT DOCUMENTS

| 8,077,467 | B2 * | 12/2011 | Chen | G11B 33/128 |
| | | | | 361/679.33 |
| 8,505,986 | B2 * | 8/2013 | Sun | H01M 50/20 |
| | | | | 292/137 |
| 8,693,208 | B2 * | 4/2014 | Reinke | G06F 13/4221 |
| | | | | 361/748 |
| 10,398,032 | B1 | 8/2019 | Bailey et al. | |
| 10,614,022 | B2 * | 4/2020 | Long | G06F 13/4022 |
| 2004/0047122 | A1 * | 3/2004 | Chen | G06F 1/184 |
| 2012/0033370 | A1 * | 2/2012 | Reinke | G06F 13/4068 |
| | | | | 361/748 |
| 2012/0235002 | A1 * | 9/2012 | Zhang | G06F 1/187 |
| | | | | 248/309.1 |
| 2014/0185208 | A1 | 7/2014 | Sun | |
| 2018/0314667 | A1 * | 11/2018 | Long | G06F 13/1668 |
| 2019/0079890 | A1 * | 3/2019 | Matula | G06F 13/4045 |

FOREIGN PATENT DOCUMENTS

| CN | 103901973 | 7/2014 |
| CN | 113009987 | 6/2021 |
| CN | 114253366 | 3/2022 |

* cited by examiner

EXPANSION MODULE, PCIE EXPANSION MODULE, CHASSIS ASSEMBLY, COMPUTER, AND SERVER CLUSTER

The present application is a U.S. National Phase Application of PCT International Application No. PCT/CN2022/ 118474, filed Sep. 13, 2022, which claims priority to Chinese patent application No. 202111165350.X, filed on Sep. 30, 2021 and entitled "Expansion Module, PCIE Expansion Module, Chassis assembly, Computer, And Server Cluster", each of which is incorporated herein by reference in their entirety.

TECHNICAL FIELD

The present application relates to the technical field of computers, and in particular to an expansion module, a PCIE expansion module, a chassis assembly, a computer, and a server cluster.

BACKGROUND

An expansion card of a server is an important component for interconnection among servers. Particularly, in the cloud data center, each server is required to interconnect with other devices in a distributed network architecture to constitute a large computer network collectively by a PCIE (peripheral component interconnect express) expansion card. A general-purpose PCIE expansion card is a structural form conforming to the PCIE specifications and is mounted within a server case. Due to the complicated mounting and maintenance processes, it is essential to remove (i.e., take off) the server from a cabinet, and perform replacement or maintenance after the upper cover of the server is opened. Inconvenience in operation and maintenance of the expansion card in a supersized data center with hundreds of thousands of servers brings about difficulties in the operation and maintenance of the data center.

SUMMARY

The present application provides an expansion module, a PCIE expansion module, a chassis assembly, a computer, and a server cluster that solve the aforesaid problem or at least partially solve the aforesaid problem.

In one embodiment of the present application, provided is an expansion module for a computer, including:

a bracket provided with a connecting arrangement, the bracket being detachably connected to the computer through the connecting arrangement; and a first circuit board provided on the bracket and having an electrical connection structure for electrically connecting the computer and an electrical connection port for electrically connecting an external device; the electrical connection structure being electrically connected to the computer through a cable;

wherein the first circuit board has two opposing ends, the electrical connecting structure being led out from or located at the first end of the first circuit board, and the second end of the first circuit board being provided with the electrical connection port; and an end portion of the bracket is provided with an end plate adapted to the mounting port, the end plate is provided with a first through hole, and the electrical connection port extends through the first through hole such that the electrical connection port is exposed when the expansion module is connected to the computer.

In another embodiment of the present application, a PCIE expansion module is provided, wherein the PCIE expansion module includes:

a bracket provided with a connecting arrangement, the bracket being detachably connected to the computer through the connecting arrangement;

a PCIE expansion circuit board provided on the bracket and having an electrical connection structure for electrically connecting the computer and an electrical connection port for electrically connecting an external device; the electrical connection structure being electrically connected to the computer through a cable;

wherein the PCIE expansion circuit board has two opposite ends; the electrical connection structure is led out from and located at the first end of the PCIE expansion circuit board; the second end of the PCIE expansion circuit board is provided with the electrical connection port; an end portion of the bracket is provided with an end plate adapted to the mounting port, the end plate is provided with a first through hole; and the electrical connection port extends through the first through hole such that the electrical connection port is exposed when the expansion module is connected to the computer.

In a further embodiment of the present application, further provided is a chassis assembly for mounting a PCIE expansion card. The chassis assembly includes a bracket and a second circuit board, wherein the bracket has a first mounting space which is used to mount the PCIE expansion card;

the second circuit board is provided on the bracket and is provided with a connecting circuit, a socket, and a cable; the connecting circuit is electrically connected to the socket and one end of the cable, respectively; the plug-in structure of the PCIE expansion card is plugged into the socket; other end of the cable is used to electrically connect the computer;

the bracket has a locking structure and a release component;

after the bracket is plugged in through the mounting port on the housing of a computer, the locking structure is locked such that the bracket is connected to an inner structure of the housing, and the release component and the electrical connection port of the PCIE expansion card are exposed; after the release component is triggered, the locking structure is unlocked such that the bracket is disconnected from the inner structure of the housing.

In a further embodiment of the present application, further provided is a computer, including:

a computer case having a housing on which a mounting port is provided and within which a second mounting space communicated with the mounting port is provided; and the expansion module for the computer provided in the embodiment above, the PCIE expansion module provided in the embodiment above, or a PCIE expansion card module obtained after the PCIE expansion card is mounted on the chassis assembly provided in the embodiment above;

wherein the expansion module for the computer, the PCIE expansion module or the PCIE expansion card module is provided in the second mounting space, and is detachably connected through the mounting port.

In a further embodiment of the present application, further provided is a server cluster which includes a plurality of servers;

a server among the plurality of servers being provided with the expansion module for the computer provided in the embodiment above, the PCIE expansion module provided in the embodiment above, or a PCIE expansion card module obtained after the PCIE expansion card is mounted on the chassis assembly provided in the embodiment above;

any one server among the plurality of servers being linked with at least one other server among the plurality of servers except for the server through the expansion module for the computer, the PCIE expansion module, or the PCIE expansion card module.

In the technical solution provided by each embodiment of the present application, a corresponding module (e.g., an expansion module, a PCIE expansion module, or PCIE expansion card module) is obtained after the first circuit board is provided on the bracket or the PCIE expansion card is mounted on the bracket. The bracket in the module (e.g., an expansion module or a PCIE expansion module) is provided with a connecting arrangement, through which the bracket is detachably connected to the computer. Since the electrical connection port of the first circuit board or the PCIE expansion card is electrically connected with the computer (e.g., a host) through a cable, an interface board (a riser interface board) is omitted, which helps to improve the high-speed signal transmission quality of the expansion module, and reduce the adverse impact of the interface board on the signal transmission quality.

BRIEF DESCRIPTION OF THE DRAWINGS

In order to more clearly illustrate the technical solutions in the embodiments of the present application or in the existing technologies, the accompanying drawings to be used in the description of the embodiments or the existing technologies will be briefly introduced below. It is obvious that the accompanying drawings described below are some embodiments of the present application. For those skilled in the art, other accompanying drawings may be obtained based on these drawings without involving any creative efforts.

DETAILED DESCRIPTION

In order to enable those skilled in the art to better understand the solutions in the present application, the technical solutions in the embodiments of the present application will be described clearly and completely below in conjunction with the accompanying drawings in the embodiments of the present application. In some procedures as described in the description, claims and accompanying drawings above, multiple operations in a particular order are included, however, these operations may not be executed according to the order herein or may be executed in parallel. The serial numbers, e.g., 101 and 102, of the operations are only used to distinguish various operations, and the serial numbers themselves do not represent any executing sequences. In addition, these procedures may include more or fewer operations, and these operations may be executed in an order or executed in parallel. It should be noted that what are described such as "first" and "second" herein are used to distinguish different modules, models, devices and the like, not representing sequences or defining that the features "first" and "second" are different types. Besides, the embodiments below are only some of the embodiments of the present application, rather than all of them. Based on the embodiments in the present application, all other embodiments obtained by those skilled in the art without any involving any creative efforts fall within the scope of protection of the present application.

Figure 1A:
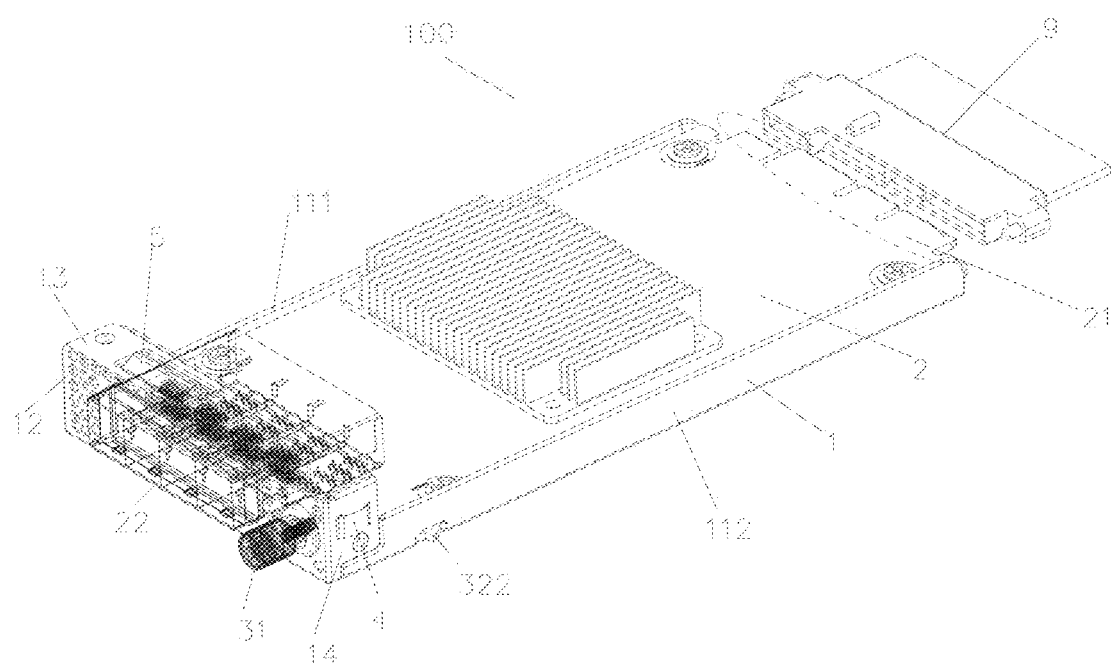
FIG. 1A shows a schematic diagram of a first structure of an expansion module for a computer provided in an embodiment of the present application.
Figure 1B:
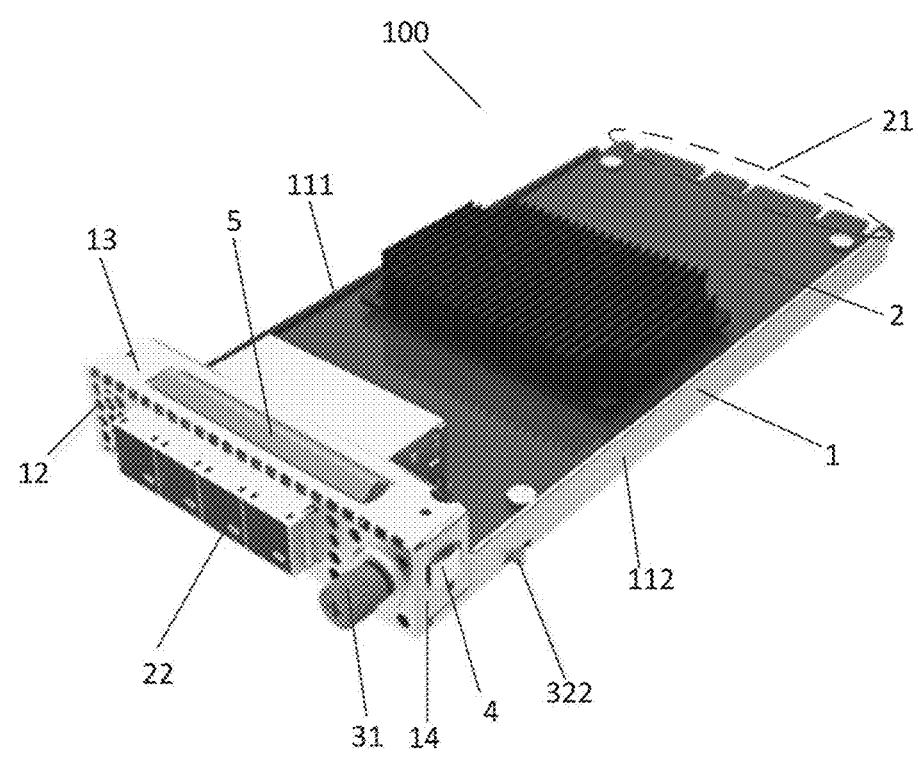
FIG. 1B shows a schematic effect diagram of the first structure of the expansion module for the computer provided in an embodiment of the present application.
Figure 3A:
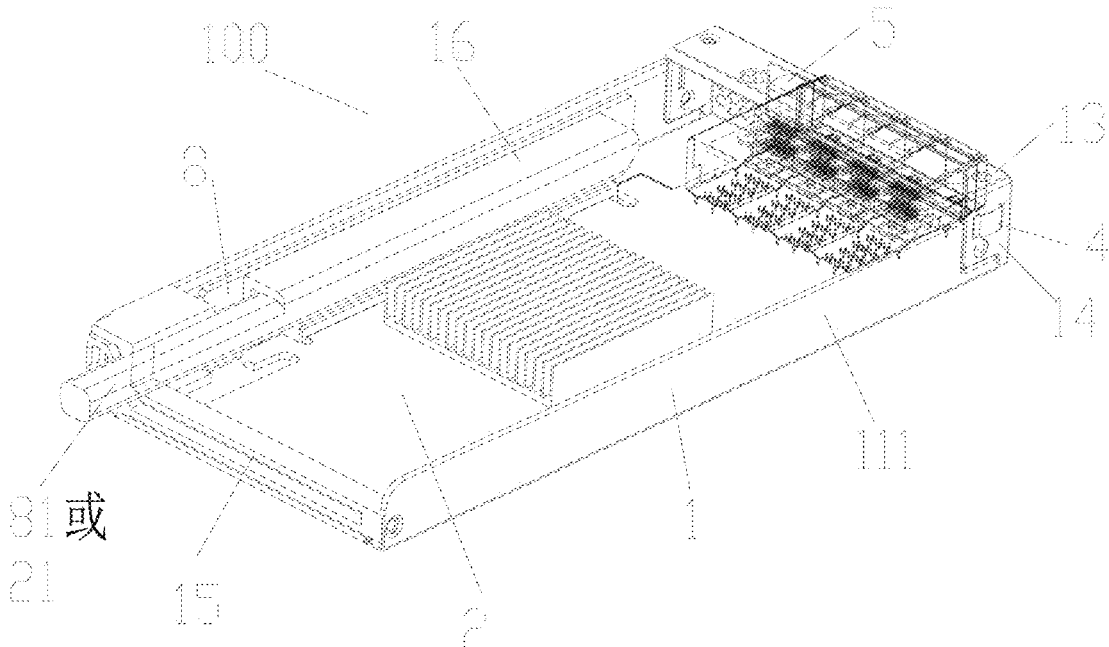
FIG. 3A shows a schematic diagram of a second structure of an expansion module for a computer provided in an embodiment of the present application.

FIGS. 1a, 1b, 3a, and 3b show schematic diagrams of two structures for implementing an expansion module for a computer provided according to the embodiments of the present application. With reference to what are shown by FIGS. 1a, 1b, and 3a, the expansion module 100 includes a bracket 1 and a first circuit board 2. Wherein, the bracket 1 is provided with a connecting arrangement. The first circuit board 2 is provided on the bracket 1, and has an electrical connection structure 21 for electrically connecting the computer and an electrical connection port 22 for electrically connecting an external device; the first circuit board 2 is electrically connected to the computer through a cable; the first circuit board 2 has two opposite ends; the electrical connection structure 21 is led out from or located at the first end of the first circuit board 2, and the second end of the first circuit board 2 is provided with the electrical connection port 22; an end portion of the bracket 1 is provided with an end plate 12 adapted to a mounting port, the end plate 12 being provided with a first through hole; the electrical connection port 22 extends through the first through hole such that the electrical connection port 22 is exposed when the expansion module 100 is connected to the computer.

Figure 2:
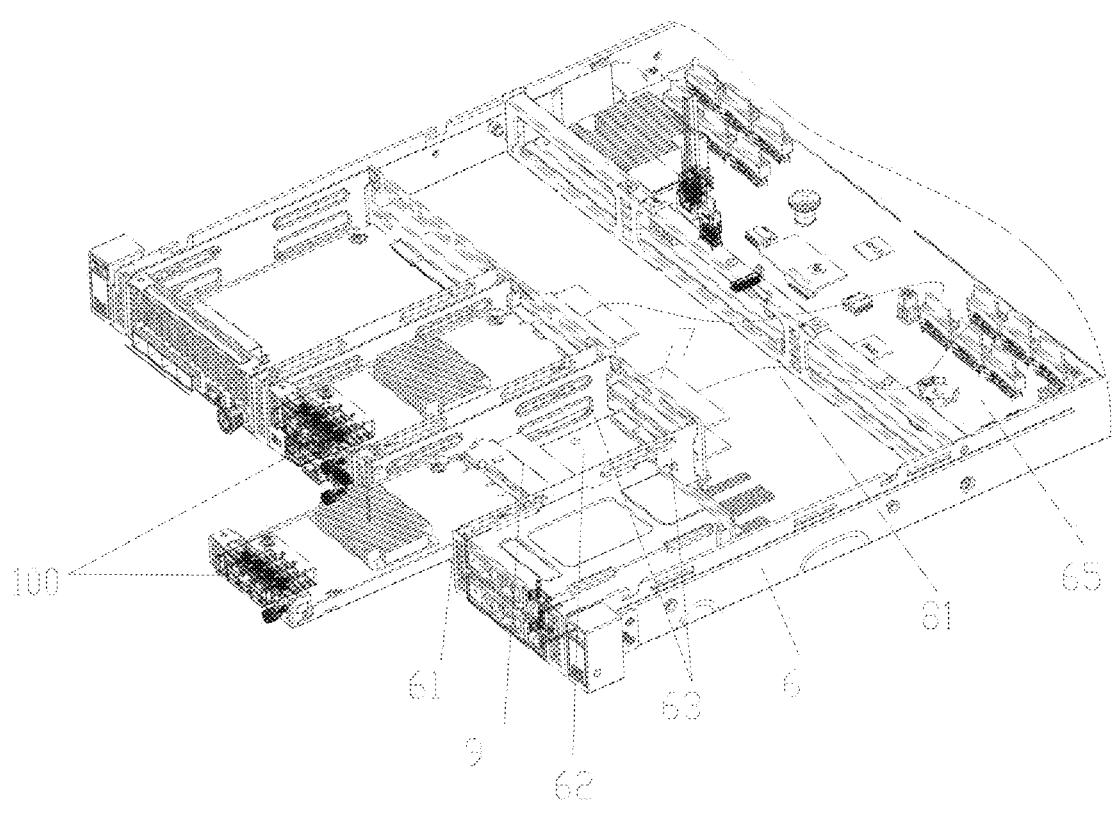
FIG. 2 shows a schematic diagram of the expansion module shown in FIG. 1 mounted on the computer.

The connecting arrangement includes a locking structure and a release component 31. As shown in FIG. 2, after the expansion card module 100 is plugged in from a mounting port 61 on the housing 6 of the computer, the locking structure is locked such that the expansion card module 100 is connected to an inner structure of the housing 6, and the release component 31 and the electrical connection port 22 are exposed; after the release component 31 is triggered, the locking structure is unlocked such that the expansion card module 100 is disconnected from the inner structure of the housing 6.

Specifically, in the embodiment shown in FIG. 2, the housing 6 of the computer may be provided therein with but not limited to: a mounting rack 63. The mounting rack 63 has two upright stands which are provided oppositely and spaced apart to form a second mounting space 62. One of the two upright stands is provided with an adaptive structure to be mated with the locking structure. The adaptive structure on the upright stand is the inner structure of the housing 6 mentioned above. The locking structure is mated with the adaptive structure to implement locking of the locking structure such that the expansion module 100 is connected to the computer. For example, the locking structure includes a snap-in hook. Correspondingly, the inner structure of the housing 6 may be a snap-in hole adapted to the snap-in hook. When the expansion card module is inserted into a position where the snap-in hook corresponds to the snap-in hole within the housing 6, the snap-in hook snaps into the snap-in hole, thereby completing locking.

Further, as shown in FIG. 2, a guide slot may be provided on two upright stands. The guide slot may be formed in a structure shown in FIG. 2 for guiding insertion of the expansion module 100. As shown in FIG. 2, a plurality of holes are provided on an upright stand. Hole edges are protruded to the second mounting space. Two adjacent hole edges of an upper and a lower hole may form the guide slot. Providing holes on the upright stand, on one hand, may reduce the total weight of the computer, and on the other hand, may form the guide slot for guiding the direction of insertion of the expansion module. Yet further, as shown in FIG. 2, a terminal plate is provided between two upright stands, and a U-shaped second mounting space is enclosed by the terminal plate and the two upright stands.

The release component 31 in the embodiment may be triggered manually. For example, the release component is triggered by means of pressing, pulling out or rotating and the like. The locking structure and the release component are linked in the embodiment. For example, when the release component is pulled out, the locking structure is unlocked; as an alternative, when the release component is pressed, the locking structure is unlocked; or when the release component is rotated, the locking structure is unlocked; and so forth.

Figure 5:
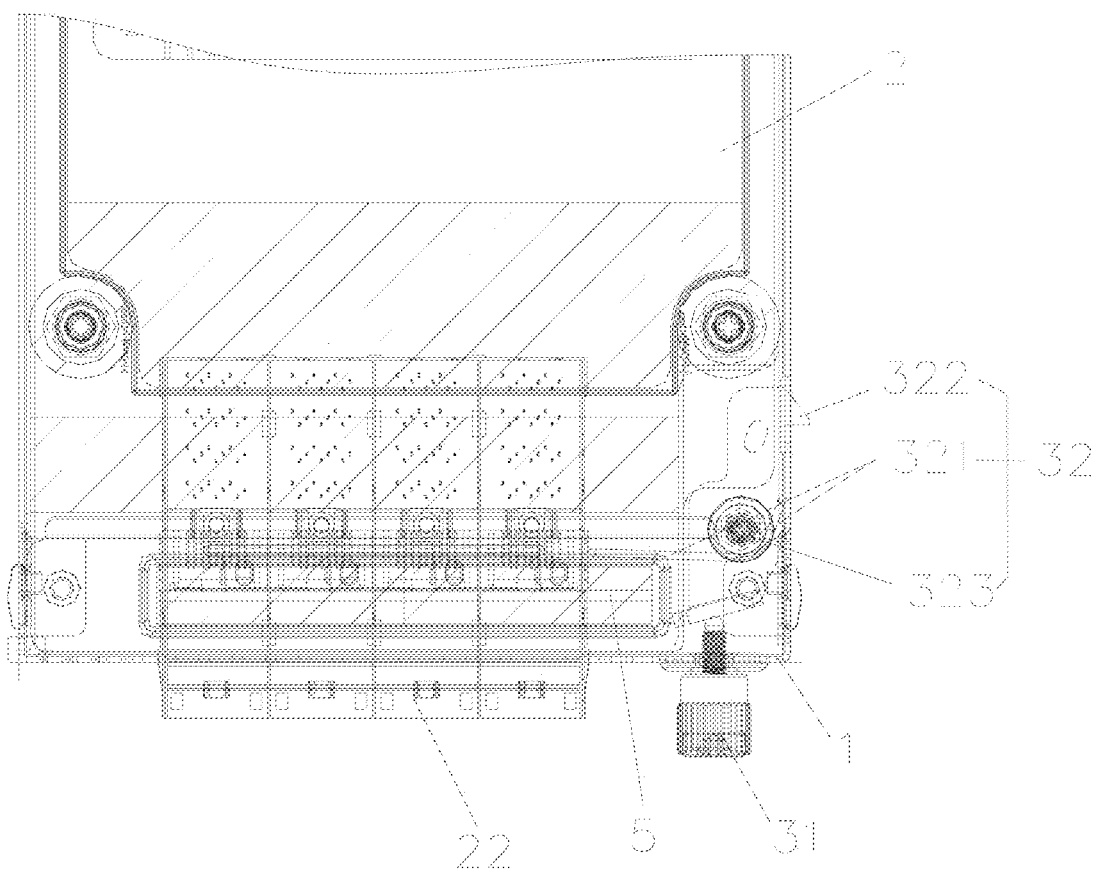
FIG. 5 shows a schematic diagram of a release component at a set location and an elastic execution assembly in an extended state.
Figure 6:
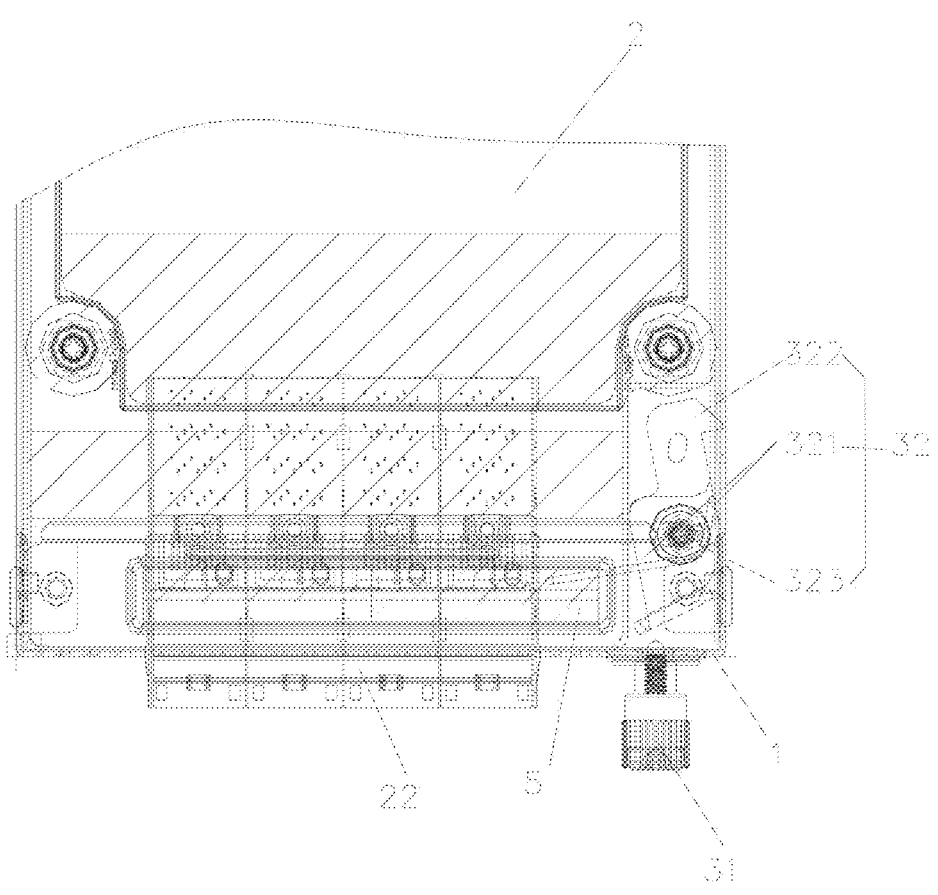
FIG. 6 shows a schematic diagram of a release component away from a set location and an elastic execution assembly in a retracted state.

FIG. 5 shows a solution which may be implemented by a connecting arrangement. As shown in FIG. 5, the locking structure includes an elastic execution assembly 32. When the release component 31 is located at a set position, the elastic execution assembly 32 is in an extended state; in the process of insertion of the expansion card module 100 through the mounting port 61, the elastic execution assembly 32 is deformed by force, and thus retracted; when the expansion card module 100 is inserted into a position corresponding to the position of the inner structure of the housing 6, the elastic execution assembly 32 returns to the extended state to be mated with the inner structure of the housing 6, and thus the expansion card module 100 is connected on the computer. Specifically, for example, if the elastic execution assembly 32 includes a snap-in hook 322. The snap-in hook 322 is deformed first and thus retracted when the expansion module is inserted into the second mounting space of the computer. Afterwards, when the expansion module is inserted in the position where the snap-in hook 322 corresponds to the inner structure of the housing (i.e. a snap-in hole on an upright stand), the snap-in hook 322 elastically returns to an extended state, and inserts in the snap-in hole. The triggered release component 31 departs from the set position. As shown in FIG. 6, the elastic execution assembly 32 moves to the retracted state with the action of the release component 31, and the expansion card module 100 is disconnected from the corresponding inner structure in the housing 6.

As reference continued to FIG. 5, the release component 31 is connected to the bracket 1 through threads. When implemented actually, the release component 31 may be a thumb screw. The release component 31, when in contact with the bracket 1, is at the set position. As shown in FIG. 6, rotation of the release component 31 away from the bracket 1 through threads is a process of triggering the release component 31 to depart from the set position.

In a technical solution which may implemented, as shown in FIGS. 5 and 6, the elastic execution assembly 32 includes a torsional spring 321 and a fastener 323. The torsional spring 321 has a first elastic end and a second elastic end. The first elastic end is provided with a snap-in hook 322. The second elastic end is moved with the release component 31. The fastener 323 is provided on the bracket 1, and the torsional spring 321 is sleeved on the fastener 323.

Further, moving the second elastic end of the torsional spring 321 with the release component 31 may be implemented by connecting the second elastic end of the torsional spring 321 to the release component 31. The release component 31 may be connected to the second elastic end of the torsional spring directly, and may also be connected to the second elastic end of the torsional spring through an intermediate member. It is easy to understand that due to direct or indirect connection of the second elastic end of the torsional spring to the release component 31, the torsional spring will act as the release component 31 acts. When the release component 31 moves away from the bracket 1, the second elastic end of the torsional spring 321 will follow such that the torsional spring 321 is rotated around the fastener 323, and therefore the first elastic end of the torsional spring 321 is retracted to the retracted state. At this time, the snap-in hook 322 comes out from the snap-in hole of the inner structure of the housing 6. Under this circumstance, the expansion module 100 is disconnected from the computer, and the expansion module 100 may be pulled out upon outward pulling.

With the structural design of the release component and the torsional spring shown in FIGS. 5 and 6, the snap-in hook is automatically popped up, thereby implementing self-locking and fastening of the expansion module when the expansion module is inserted in the housing of the computer. However, when the expansion module is intended to be pulled out from the computer, the release component must be twisted (e.g., unscrewed so as to be away from the bracket) such that the snap-in hook can be unlocked. Such design may further implement the fool-proofing function during assembly and disassembly at the same time. During insertion, reliable self-locking and fastening of an expansion module may be ensured without a release component; during pulling out, unlocking of the release component (rotation through threads) must be triggered to prevent pulling out of the expansion module due to accidental maloperation.

Figure 4:
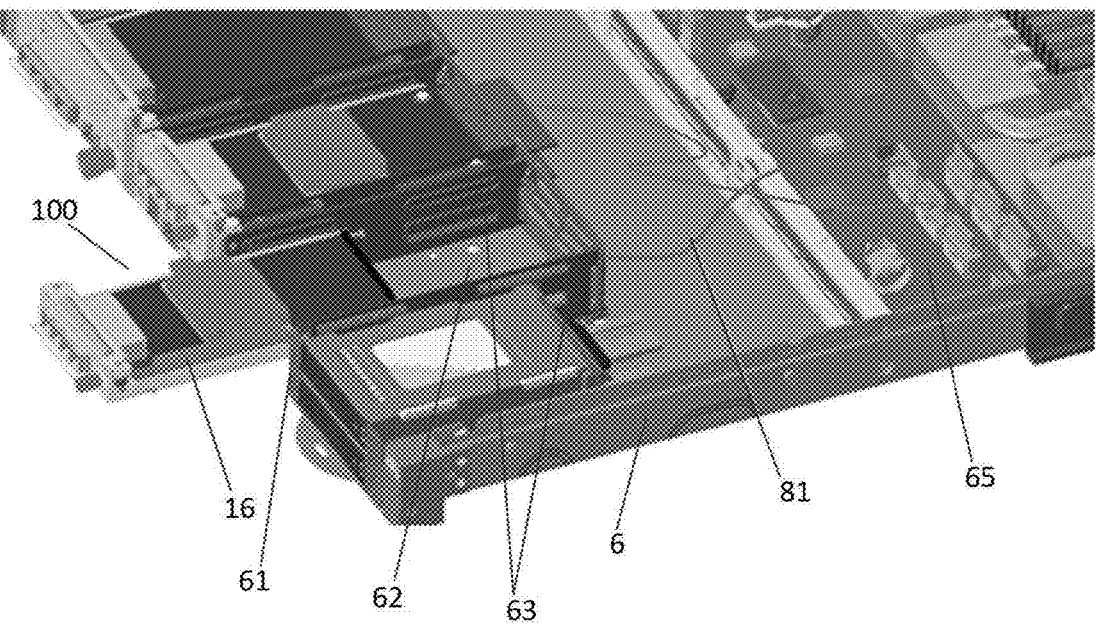
FIG. 4 shows a schematic diagram of the expansion module shown in FIG. 3 mounted on the computer.

As shown in FIGS. 2 and 4, the mounting port 61 may be provided on the front panel or rear panel of the housing 6 of the computer. In this way, the expansion module 100 may be inserted in or pulled out from the front panel or rear panel of the housing 6 of the computer, thereby accomplishing the object of inserting in or pulling out the expansion module without removing the panel from the housing. If a computer mounted with an expansion module provided in the embodiment is a server in the data center, switching between plug-in and pulling out of an expansion model may be implemented by using the server in the solution provided in the embodiment in the event that the server is not removed, which may save a substantial amount of time, ease inconvenience in disassembly, and greatly shorten the downtime during operation and maintenance.

In view of the above, the key inventive points of the technical solutions provided in the embodiments of the present application include but not limited to the points below:

1. The disassembly of an expansion module without removing the housing of the computer is achieved, which facilitates replacement or maintenance of the expansion module.

2. A connecting arrangement with fool-proofing design is provided. As in the contents above, an expansion module, when mounted, is directly plugged in a second mounting space within the mounting port on the housing of the computer, and thus the locking apparatus can perform self-locking. When disassembly of the expansion module is required, it is necessary for the user to trigger the release component (e.g., unscrewing the release component), and then the expansion module can be disconnected from the computer. Such fool-proofing design may prevent pulling out of the expansion module due to accidental maloperation.

Further, the first circuit board 2 has two opposite ends. The electrical connection structure 21 is led out from or located at the first end of the first circuit board 2, and the second end of the first circuit board 2 is provided with the electrical connection port 22. The bracket 1 has two opposite ends with the first end of the bracket 1 corresponding to the first end of the first circuit board 2, and the second end of the bracket 1 corresponding to the second end of the first circuit board 2. The second end of the bracket 1 is provided with an end plate 12 adapted to the mounting port 61, the end plate 12 is provided with a first through hole; the electrical connection port 22 extends out of the first through hole. In this way, after the expansion module is mounted in the housing of the computer, the end plate 12 and the electrical connection port 22 extends from the end plate 12 are exposed, which facilitates connection to an external device through the electrical connection port 22. The release component 31 is provided on the end plate 12, and located on one side of the electrical connection port 22. After the expansion module is mounted within the housing of the computer, the release component 31 is also exposed, which facilitates triggering (e.g., rotating, pulling out or pressing down, etc.).

In an exemplary structure as shown in FIGS. 1a and 1b, the electrical connection structure 21 is a plug-in structure located at the first end of the first circuit board 2, and the plug-in structure goes beyond the bracket 1 at the first end of the bracket 1 to facilitate insertion of the plug-in structure into the corresponding electrical connection slot. In a specific application scenario, the computer in the embodiment may be a server. For example, as for a server cluster deployed in the data center, a plurality of servers are required to be interconnected through a PCIE expansion module. That is, the first circuit board 2 in the embodiment may be a PCIE expansion circuit board, and the electrical connection structure 21 is a golden finger structure on the PCIE expansion circuit board.

As shown in FIG. 2, the terminal plate (mentioned above) in the inner structure of the housing of the computer may be provided with an electrical connection slot. In a specific implementation, as shown in FIG. 2, the electrical connection slot 7 may be a slot for electrically connecting the first circuit board 2 to the cable 81. For example, the first circuit board 2 is a PCIE expansion circuit board provided with a gold finger structure. The electrical connection slot 7 is adapted to the gold finger structure. In addition, the cable 81 may be a cable (a cable TV cable). Herein, an expansion module (i.e., a first circuit board 2 included) is electrically connected to a component (e.g., a mainboard) within the computer with a cable, and thus an interface board (a riser interface board) is omitted, which helps to improve the high-speed signal transmission quality of the expansion module, and reduce the adverse impact of the interface board on the signal transmission quality.

Figure 3B:
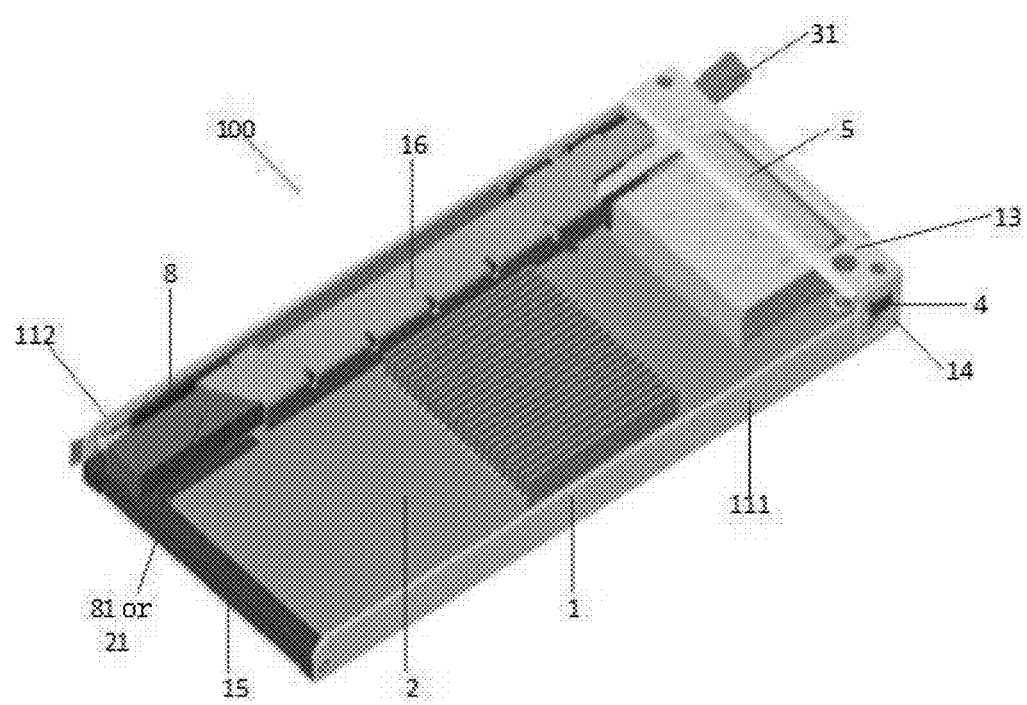
FIG. 3B shows a schematic effect diagram of the second structure of the expansion module for the computer provided in an embodiment of the present application.
Figure 3C:
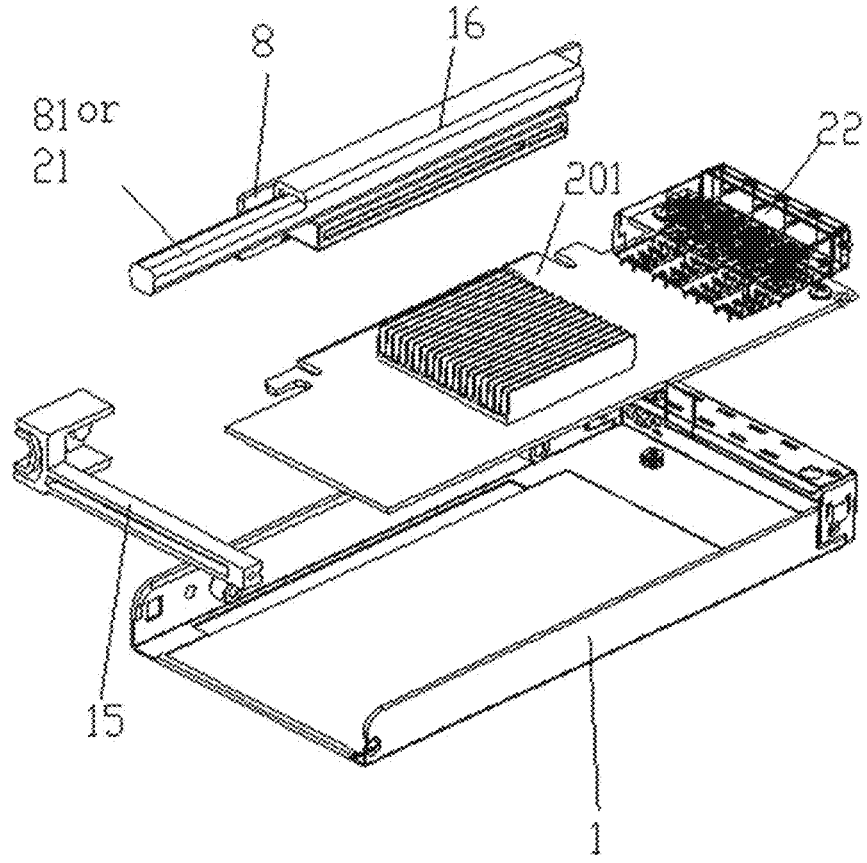
FIG. 3C shows an exploded schematic diagram of the second structure of the expansion module for the computer provided in an embodiment of the present application.

As for the PCIE expansion cards used on existing computers (e.g., servers), most of the expansion cards have the structure of the expansion card shown in FIG. 3c. As for such PCIE expansion cards, the corresponding design concepts in the embodiments above are intended to be used to facilitate dismounting. The embodiment further provides a solution where existing PCIE expansion cards are compatible. As shown in FIGS. 3a and 3b, the first circuit board 2 may be a PCIE expansion card shown in FIG. 3c. A second circuit board 8 is provided on the bracket 1 and is provided with a connecting circuit, a socket, and a cable. The structure of the second circuit board 8 is not shown in FIGS. 3a and 3b in a detailed manner. Reference may be made to FIG. 3c. The connecting circuit is electrically connected to the socket and one end of the cable, respectively. The plug-in structure of the PCIE expansion card is plugged into the socket. Correspondingly, the electrical connection structure 21 is the cable 81 led out from the second circuit board 8 shown in FIGS. 3a and 3b, and the cable 81 is led out from the first end of the PCIE expansion card (i.e., an end opposite to the electrical connection port of the PCIE expansion card).

Similarly, the cable 81 may be a cable (cable TV cable) or other types of cable. No limitation is made to this in the embodiment.

More specifically, as shown in FIGS. 3a and 3b, an end portion of the bracket 1 corresponding to the first end of the PCIE expansion card (i.e., an end opposite to the electrical connection port of the PCIE expansion card) may be provided with a card tail stopper 15.

Further, the second circuit board 8 is located on one side of the PCIE expansion card, and the second circuit board 8 has a first surface facing towards the PCIE expansion card and a second surface facing away from the PCIE expansion card; the socket is located on the first surface; one end of the cable 81 is located on the second surface; the cable 81 is led out from the second surface, is bunched within the cable shield 16 on the side of the second surface, and is led out from the first end of the PCIE expansion card (i.e., an end opposite to the electrical connection port of the PCIE expansion card) along the cable shield 16 so as to electrically connect the computer. As shown in FIG. 4, the cable 81 led out on the second circuit board 8 is extended out from the first end of the PCIE expansion card so as to electrically connect the mainboard of the computer.

As for the PCIE expansion card shown in FIG. 3c, the electrical connection port 22 is provided at an end portion of the PCIE expansion card, and the gold finger structure (i.e., a specific form of implementing an electrical connecting structure mentioned herein) is located on one side of the PCIE expansion card. As for the PCIE expansion card shown in FIG. 3c, the second circuit board 8 in the embodiment may be provided on the second side plate 112 of the bracket. For example, the second circuit board 8 shown in FIG. 3c is provided in parallel to the second side plate 112, with the first surface of the second circuit board 8 facing away from the adjacent second side plate 112; the second surface of the second circuit board 8 facing toward the adjacent second side plate 112. When a PCIE expansion card is mounted, the first side plate 111 on the bracket 1 is open, and the mounted PCIE expansion card is plugged in from the first side plate 111 such that the gold finger structure of the PCIE expansion card is plugged in the socket on the first surface of the second circuit board 8. Afterwards, the first side plate 111 is mounted, with a fastener (e.g., a screw), on the support plate of the bracket 1 or on an end portion of the card tail stopper in FIG. 3*b*.

As shown in FIG. 4, after the PCIE expansion card is mounted on the bracket shown in FIG. 3*a*, the electrical connection of the PCIE expansion card and the second circuit board on the bracket is completed; the gold finger structure (i.e., a form of implementing an electrical connecting structure) of the PCIE expansion card is led out through the cable 81 on the bracket, and is then electrically connected to the computer through the cable 81. For example, it is electrically connected to the mainboard of the computer through the cable 81, and thus an interface board is omitted, which helps to improve the high-speed signal transmission quality of the expansion module, and reduce the adverse impact of the interface board on the signal transmission quality.

For the structure of the bracket in the embodiment, reference may be made to FIGS. 1*a*, 1*b*, 3*a*, and 3*b*. The bracket 1 includes: a support plate (not clearly shown), two side plates, and the end plate 12, wherein the two side plates are a first side plate 111 and a second side plate 112, respectively. The first side plate 111, the second side plate 112 and the end plate 12 are provided on plate edges of the support plate, and the end plate 12 is located between the two side plates. The locking structure includes a snap-in hook 322; one of the two side plates is provided with an opening. In the embodiment as shown in FIG. 1, the second side plate 112 is provided with an opening. The snap-in hook 322 is extendable from the opening for connection with an inner structure (such as a snap-in hole) of a housing 6, and the snap-in hook 322 is also retractable from the opening for disconnection from the inner structure of the housing 6.

Further, as shown in FIGS. 1*a*, 1*b*, 3*a*, and 3*b*, a top plate 13 in parallel to the support plate is provided on the end plate 12; an elastic strip 5 is provided on at least one of the support plate and the bottom of the top plate 13 and is used to abut against the port inner wall on a corresponding side of the mounting port 61.

Yet further, as shown in FIGS. 1*a*, 1*b*, 3*a*, and 3*b*, the bracket 1 further includes two connecting plates 14; the end plate 12 is located between the two connecting plates 14; the two connecting plates 14 are connected to plate edges of the top plate 13, the end plate 12, and the two side plates (i.e., the first side plate 111 and the second side plate 112) on respective sides at the second end of the bracket; an elastic member 4 is provided on at least one connecting plate of the two connecting plates 12 and is used to abut against the port inner wall on a corresponding side of the mounting port 61.

A gap between an expansion module and port inner walls of the mounting port in a first direction may be eliminated by providing the elastic strip 5, and thus slosh of the expansion module 100 in the first direction may be prevented. A gap between an expansion module and the port inner walls of the mounting port in a second direction may be eliminated by providing the elastic member 4 above, and thus slosh of the expansion module 100 in the second direction may be prevented. Wherein the first direction is perpendicular to the second direction. For example, the first direction is a vertical direction, while the second direction is a horizontal direction.

Figure 7:
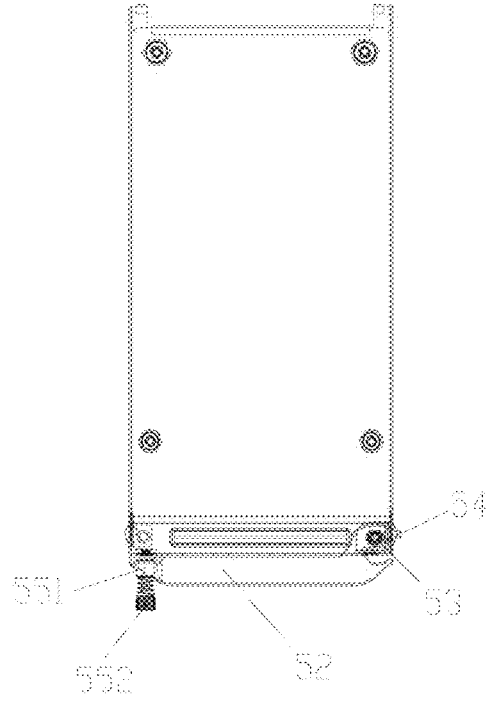
FIG. 7 shows a schematic diagram of the locking structure of a lever wrench in an expansion module for a computer provided in an embodiment of the present application.
Figure 8:
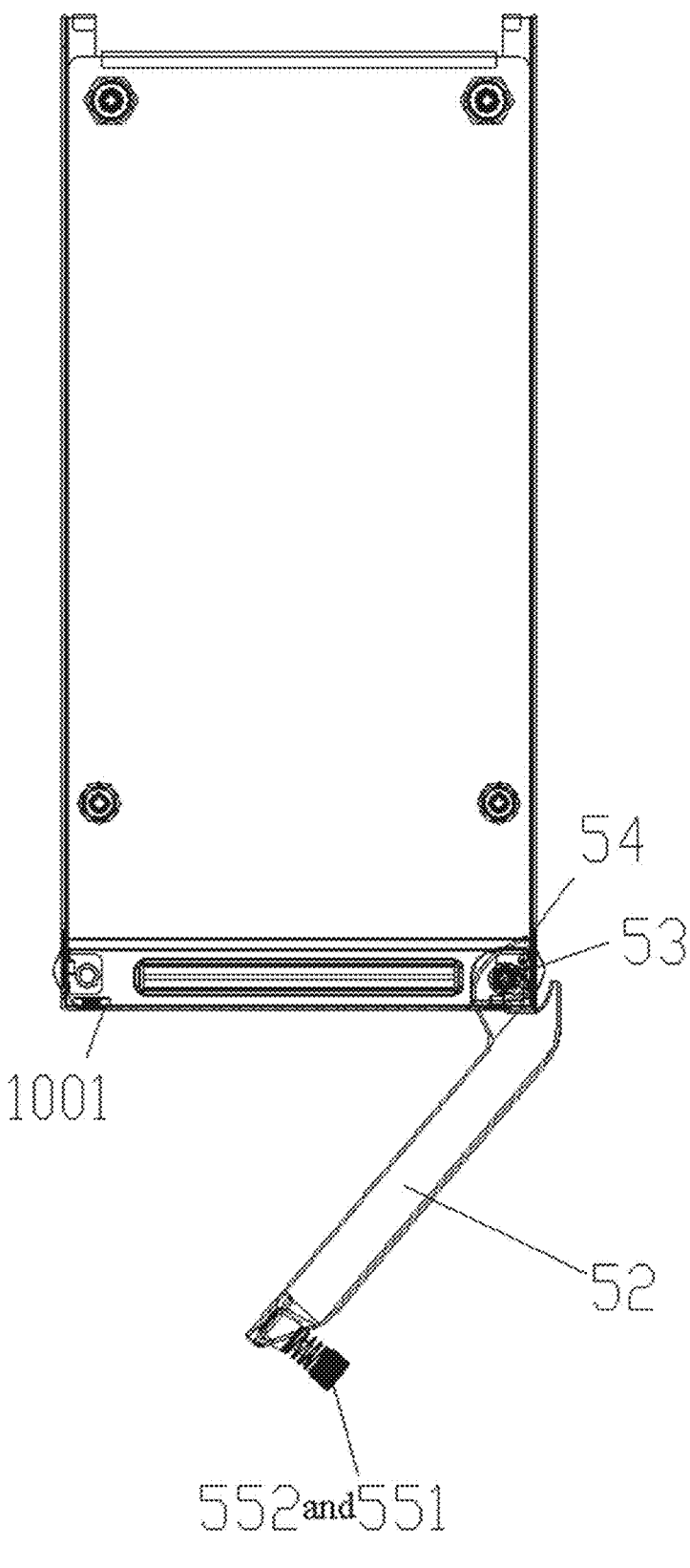
FIG. 8 is a schematic diagram of the unlocking structure of a lever wrench in an expansion module for a computer provided in an embodiment of the present invention.

FIGS. 7 and 8 show another structure which may implement a connecting arrangement. As shown in FIGS. 7 and 8, the connecting arrangement includes a lever wrench 52 with one end thereof connected to the bracket 1. A plug-in tongue 54 is provided at a location of the lever wrench located on a rotating shaft 53, and an opening is provided at a location of the bracket 1 corresponding to the plug-in tongue 54, facilitating extension and retraction of the plug-in tongue 54 at the opening. The other end of the lever wrench 52 away from the rotating shaft 53 is provided with a handle 552 and a fastening structure 551. The bracket 1 is provided with a fitting structure to cooperate with an operation of the fastening structure 551. As shown in FIG. 7, after the expansion module is plugged in through the mounting port on the housing of the computer, the distal end (i.e., an end of the handle 552) of the lever wrench 52 is rotated in a direction towards the bracket 1, and the plug-in tongue 54 is extended out (as shown in FIG. 7) for connection with an inner structure of the housing. When the distal end of the lever wrench 52 is rotated to correspond to the fitting structure of the bracket 1, the connection of the expansion module to the housing of the computer is locked through the fastening structure 551 and the fitting structure. As shown in FIG. 8, after the fastening structure 551 is disconnected from the fitting structure, the distal end of the lever wrench 52 is rotated in a direction away from the bracket 1, the plug-in tongue 54 is retracted, and the expansion card module is disconnected from the housing of the computer.

Specifically, as shown in FIG. 8, the fastening structure 551 may include a threaded rod and a spring, wherein the threaded rod is connected to the handle 552, and the spring is sleeved on the threaded rod and is located on the handle 552 to connect the lever wrench. When the handle is rotated by a user, the threaded rod may be screwed into a threaded hole of the bracket, thereby completing connection. That is, the fitting structure on the bracket may be a threaded hole fitted with the threaded rod.

Specific product forms are taken as an example below to illustrate the design solutions provided in the embodiments of the present application. That is, an expansion module is limited as a PCIE expansion module in the embodiments below. One embodiment is a PCIE expansion module designed by using the design concepts provided in the embodiments of the present application. The PCIE expansion module is similar to the structure shown in FIG. 1. The PCIE expansion module includes: a bracket 1 and a PCIE expansion circuit board. The PCIE expansion circuit board here corresponds to a first circuit board in FIG. 1. Wherein the bracket 1 is provided with a connecting arrangement which includes a locking structure and a release component 31. The PCIE expansion circuit board is provided on the bracket 1, and the PCIE expansion circuit board has an electrical connection structure 21 for electrically connecting the computer and an electrical connection port 22 for electrically connecting an external device. As shown in FIG. 2, after the expansion card module 100 is plugged in through the mounting port 61 of the housing 6 of the computer, the locking structure is locked such that the expansion card module is connected to an inner structure of the housing 6, and the release component 31 and the electrical connection port 22 are exposed; after the release component 31 is triggered, the locking structure is unlocked such that the expansion card module is disconnected from the inner structure of the housing.

The first circuit board above may be replaced with the PCIE expansion circuit board in the present embodiment. PCIE (Peripheral Component Interconnect Express) is a high-speed serial computer extension bus standard. PCIE belongs to high-speed serial point-to-point dual-channel high-bandwidth transmission. The connected devices allocate exclusive channel bandwidths, but do not share a bus bandwidth, mainly supporting functions such as active power management, error reporting, end-to-end reliable transmission, hot plug, and quality of service (QOS). With regard to PCIE as an important branch of a computer bus, it follows existing PCI programming concepts and signal standards, and constructs a higher speed serial communication system standard. Moreover, with the development of computer technologies, it is updated and upgraded constantly, and the transmission rate that may be supported is increasingly faster.

It should be noted that no limitation is made to the design of the circuit on the PCIE expansion circuit board. Any circuit that may implement the PCIE expansion functions is appropriate as long as the electrical connection structure and electrical connection port of the PCIE expansion circuit board may be designed in the manner mentioned in the embodiment. Besides, as for the structures such as locking structure, release component, and bracket included in the connecting arrangement in the embodiment, reference may be made to the contents in the embodiments and accompanying drawings above. No more details will be repeated here.

Another embodiment is a chassis assembly compatible with an existing PCIE expansion card designed by the design concepts provided in the embodiments of the present application. A PCIE expansion card module (e.g., the PCIE expansion card module shown in FIG. 3a) which is easily dismounted, may be obtained by mounting the existing PCIE expansion card (e.g., the a PCIE expansion card shown in FIG. 3b) on the chassis assembly provided in the embodiment. Specifically, the chassis assembly provided in the embodiment includes: the bracket 1 and a second circuit board 8. The bracket 1 has a first mounting space which is used to mount a PCIE expansion card. The second circuit board is provided on the bracket and is provided with a connecting circuit, a socket, and a cable. The connecting circuit is electrically connected to the socket and one end of the cable, respectively. The plug-in structure of the PCIE expansion card is plugged in the socket. The other end of the cable is used to electrically connect the computer. The bracket has a locking structure and a release component. After the bracket is plugged in through the mounting port on the housing of the computer, the locking structure is locked such that the bracket is connected to an inner structure of the housing, and the release component and the electrical connection port of the PCIE expansion card are exposed. After the release component is released, the locking structure is unlocked such that the bracket is disconnected from the inner structure of the housing.

It should be noted that the specific structure of the PCIE expansion card is not limited in the embodiment. Besides, as for the structures such as locking structure, release component, and bracket included by the connecting arrangement in the embodiment, reference may be made to the contents in the embodiments and accompanying drawings above. No more details will be repeated here.

FIGS. 2 and 4 show a schematic diagram of a local structure of a computer provided in an embodiment of the present application. In FIGS. 2 and 4, in order to facilitate observation of a structure within a computer case, a part of the computer case may be removed to expose the inner structure of the computer case. The computer in the embodiment may be a desktop used by a user, may be a server, and may also be a server in a server cluster within the data center, and the like. No limitation is made thereto in the embodiment. Specifically, as shown in FIGS. 2 and 4, the computer includes a computer case which has a housing 6 on which a mounting port 61 is provided and within which a second mounting space 62 communicated with the mounting port 61 is provided; and the expansion module for the computer provided in the embodiment above, the PCIE expansion module provided in the embodiment above, or a PCIE expansion card module obtained after the PCIE expansion card is mounted on the chassis assembly provided in the embodiment above. The expansion module for the computer, the PCIE expansion module or the PCIE expansion card module is provided within the second mounting space, and can be dismounted through the mounting port.

It should be noted here that with regard to the specific structure of the expansion module for the computer, the PCIE expansion module, or the PCIE expansion card module, reference may be made to the corresponding description above. No more details will be repeated here.

The existing general-purpose PCIE expansion card, such as the PCIE expansion card shown in FIG. 3b, was born in the PC era, whose design solution is to provide a PCIE expansion card within the case of a computer. During replacement or maintenance, it is necessary to dismount the housing of the computer, and then replace or maintain the PCIE expansion card. As for computers (also referred to as servers) in a hyperscale data center, if removal of housing from most computers is required, this will inevitably waste a substantial amount of time. In addition, when an existing general-purpose PCIE expansion card which is limited to the structural forms in the PCIE specifications is mounted in computers (such as servers), it must be connected to the mainboard of the computer through an interface board (e.g., a riser interface board), which increases the material cost of the interface board, and also increases losses in communication links due to the interface, thereby invisibly increasing the difficulties in and costs of the high-speed communication design.

A computer (e.g., a server) implemented by using the technical solutions provided in respective embodiments of the present application has but is not limited to the following technical effects:

1. It is easy to dismount an expansion module provided in an embodiment of the present application from a computer.

Another embodiment of the present application further provides a solution where an existing PCIE expansion card is compatible, that is, providing a chassis assembly. The existing PCIE expansion card is mounted on the chassis assembly, and this may accomplish the object of easy dismounting.

3. A cable is used in respective embodiments of the present application to implement electrical connection of an expansion module or PCIE expansion card with the mainboard of the computer, and thus an interface board is removed, which helps to improve the high-speed signal transmission quality of the expansion module, and reduce the adverse impact of the interface board on the signal transmission quality.

4. Corresponding chassis assembly may be designed according to PCIE expansion cards with different heights and widths so to be compatible with mounting of the PCIE expansion cards with various complex functions such that the various PCIE expansion cards have a function of convenient disassembly.

Further, a further embodiment of the present application provides a server cluster which includes a plurality of servers. A server among the plurality of servers is provided with the expansion module for the computer provided in the embodiment above, the PCIE expansion module provided in the embodiment above, or a PCIE expansion card module obtained after the PCIE expansion card is mounted on the chassis assembly provided in the embodiment above. Any server among the plurality of severs is linked with at least one server among the plurality of servers except for the server through the expansion module for the computer, the PCIE expansion module or the PCIE expansion module.

It should be noted at last that the embodiments above are only for illustrating the technical solutions of the present application, not for limiting them. Although the present application is described in a detailed manner with reference to the preceding embodiments, those skilled in the art should understand that it is possible to make modifications to the technical solutions disclosed in the foregoing embodiments, or conduct equivalent replacements of some technical features therein. These modifications or replacements do not make the essence of corresponding technical solutions depart from the spirt and principles of the technical solutions in respective embodiments in the present application.

What is claimed is:

1. An expansion module for a computer, comprising:
a bracket provided with a connecting arrangement, the bracket being detachably connected to the computer through the connecting arrangement; and
a first circuit board provided on the bracket and having an electrical connection structure for electrically connecting the computer and an electrical connection port for electrically connecting an external device, the first circuit board being electrically connected to the computer through a cable,
wherein the first circuit board has two opposite ends, the electrical connection structure is led out from or located at a first end of the first circuit board, and a second end of the first circuit board is provided with the electrical connection port, wherein the electrical connection structure goes beyond the bracket; and
an end portion of the bracket is provided with an end plate adapted to a mounting port of the computer, the end plate is provided with a first through hole, and the electrical connection port extends through the first through hole such that the electrical connection port is exposed when the expansion module is connected to the computer;
wherein a housing of the computer has a second mounting space communicated with the mounting port, the second mounting space is formed by two upright stands that are provided oppositely and spaced apart, and the upright stands are provided with a plurality of holes with hole edges protruded to the second mounting space, and two adjacent hole edges of upper and lower holes form a guide slot for guiding insertion of the expansion module.

2. The expansion module for the computer of claim 1, wherein the electrical connection structure is a plug-in structure located at the first end of the first circuit board, and the plug-in structure goes beyond the bracket at a first end of the bracket so as to facilitate insertion of the plug-in structure into a corresponding electrical connection slot.

3. The expansion module for the computer of claim 2, wherein the first circuit board is a PCIE expansion circuit board, and the electrical connection structure is a gold finger structure on the PCIE expansion circuit board.

4. The expansion module for the computer of claim 1, wherein the first circuit board is a PCIE expansion card;
a second circuit board is provided on the bracket and is provided with a connecting circuit, a socket, and a cable, and the connecting circuit is electrically connected to the socket and one end of the cable respectively;
the plug-in structure of the PCIE expansion card is plugged into the socket; and
the electrical connection structure is the cable being led out from a first end of the PCIE expansion card.

5. The expansion module for the computer of claim 4, wherein the second circuit board is located on one side of the PCIE expansion card;
the second circuit board has a first surface facing towards the PCIE expansion card and a second surface facing away from the PCIE expansion card;
the socket is located on the first surface, and one end of the cable is located on the second surface;
the cable is led out from the second surface, is bunched within a cable shield on the second surface, and is led out from the first end of the PCIE expansion card along the cable shield so as to electrically connect the computer.

6. The expansion module for the computer of claim 1, wherein the bracket comprises a support plate, two side plates, and the end plate;
the two side plates and the end plate are provided on plate edges of the support plate, and the end plate is located between the two side plates;
the connecting arrangement comprises a snap-in hook;
one of the two side plates is provided with an opening, the snap-in hook is extendable from the opening to connect an inner structure of the housing of the computer, and the snap-in hook is also retractable from the opening to disconnect the inner structure of the housing.

7. The expansion module for the computer of claim 6, wherein a top plate in parallel to the support plate is provided on the end plate;
at least one of the top plate and bottom of the support plate is provided with an elastic strip for abutting against a port inner wall on a corresponding side of the mounting port.

8. The expansion module for the computer of claim 7, wherein the bracket further comprises two connecting plates;
the end plate is located between the two connecting plates;
the two connecting plates are connected to plate edges of the top plate, the end plate, and the two side plates on respective sides at the second end of the bracket;
at least one of the two connecting plates is provided with an elastic member for abutting against a port inner wall on a corresponding side of the mounting port.

9. The expansion module for the computer of claim 1, wherein the connecting arrangement comprises a locking structure and a release component;
wherein after the expansion card module is plugged through the mounting port on the housing of the computer, the locking structure is locked such that the expansion card module is connected to an inner structure of the housing, and the release component and the electrical connection port are exposed; after the release component is triggered, the locking structure is unlocked such that the expansion card module is disconnected from the inner structure of the housing;

the bracket has two opposite ends with a first end of the bracket corresponding to the first end of the first circuit board and a second end of the backet corresponding to the second end of the first circuit board; the end plate is located on the second end of the bracket; and the release component is provided on the end plate and located on one side of the electrical connection port.

10. The expansion module for the computer of claim 1, wherein the connecting arrangement comprises a lever wrench;

one end of the lever wrench is rotatably connected to the bracket; a plug-in tongue is provided at a location of the lever wrench located on a rotating shaft; an opening is provided at a location of the bracket corresponding to the plug-in tongue so as to facilitate extension and retraction of the plug-in tongue at the opening;

other end of the lever wrench away from the rotating shaft is provided with a handle and a fastening structure; a fitting structure is provided on the bracket to cooperate with the fastening structure;

wherein, after the expansion card module is plugged in through the mounting port on the housing of the computer, a distal end of the lever wrench is rotated in a direction towards the bracket, and the plug-in tongue is extended to connect to the inner structure of the housing; when a distal end of the lever wrench is rotated to correspond to the fitting structure of the bracket, connection of the expansion card module with the housing of the computer is locked by cooperation of the fastening structure and the fitting structure; after the fastening structure is disconnected from the fitting structure, the distal end of the lever wrench is rotated in a direction away from the bracket, the plug-in tongue is retracted, and the expansion card module is disconnected from the housing of the computer.

11. A PCIE expansion module, comprising:

a bracket provided with a connecting arrangement, the bracket being detachably connected to a computer through the connecting arrangement; and a PCIE expansion circuit board provided on the bracket and having an electrical connection structure for electrically connecting the computer and an electrical connection port for electrically connecting an external device; the electrical connection structure being connected to the computer through a cable;

wherein the PCIE expansion circuit board has two opposite ends, the electrical connection structure is led out from and located at a first end of the PCIE expansion circuit board, and a second end of the PCIE expansion circuit board is provided with the electrical connection port, wherein the electrical connection structure goes beyond the bracket; an end portion of the bracket is provided with an end plate adapted to a mounting port of the computer, the end plate is provided with a first through hole, and the electrical connection port extends through the first through hole such that the electrical connection port is exposed when the expansion module is connected to the computer;

wherein a housing of the computer has a second mounting space communicated with the mounting port, the second mounting space is formed by two upright stands that are provided oppositely and spaced apart, and the upright stands are provided with a plurality of holes with hole edges protruded to the second mounting space, and two adjacent hole edges of upper and lower holes form a guide slot for guiding insertion of the expansion module.

12. A chassis assembly, comprising a bracket and a second circuit board, wherein the bracket has a first mounting space for mounting a PCIE expansion card;

the second circuit board is provided on the bracket and is provided with a connecting circuit, a socket, and a cable; the connecting circuit is electrically connected to the socket and one end of the cable, respectively; a plug-in structure of the PCIE expansion card is plugged into the socket; other end of the cable is used to electrically connect a computer; and the bracket has a connecting arrangement, and the bracket is detachably connected to the computer through the connecting arrangement;

wherein the bracket is inserted into the computer from a mounting port of the computer, a housing of the computer has a second mounting space communicated with the mounting port, the second mounting space is formed by two upright stands that are provided oppositely and spaced apart, and the upright stands are provided with a plurality of holes with hole edges protruded to the second mounting space, and two adjacent hole edges of upper and lower holes form a guide slot for guiding insertion of the bracket.

13. A computer, comprising:

a computer case having a housing on which a mounting port is provided and within which a second mounting space communicated with the mounting port is provided; and the expansion module for the computer of claim 1, the PCIE expansion module of claim 11, or a PCIE expansion card module obtained after the PCIE expansion card is mounted on the chassis assembly of claim 12;

wherein the expansion module for the computer, the PCIE expansion module or the PCIE expansion card module is provided within the second mounting space, and is detachably connected through the mounting port.

14. A server cluster, comprising a plurality of servers;

a server among the plurality of servers being provided with the expansion module for the computer of claim 1, the PCIE expansion module of claim 11, or a PCIE expansion card module obtained after the PCIE expansion card is mounted on the chassis assembly of claim 12;

any one server among the plurality of servers being linked with at least one other server among the plurality of servers except for the server through the expansion module for the computer, the PCIE expansion module or the PCIE expansion card module.

* * * * *